(12) United States Patent
Kechmire

(10) Patent No.: US 6,577,107 B2
(45) Date of Patent: Jun. 10, 2003

(54) METHOD OF TESTING A LEAD BATTERY FOR THE PURPOSE OF CHARGING IT UNDER OPTIMAL CONDITIONS

(75) Inventor: Mohamed Kechmire, Brebieres (FR)

(73) Assignee: Hawker S.A., Arras (FR)

( * ) Notice: Subject to any disclaimer, the term of this patent is extended or adjusted under 35 U.S.C. 154(b) by 0 days.

(21) Appl. No.: 09/931,246

(22) Filed: Aug. 17, 2001

(65) Prior Publication Data
US 2002/0030495 A1 Mar. 14, 2002

(30) Foreign Application Priority Data
Aug. 17, 2000 (FR) .............................. 00 10690

(51) Int. Cl.$^7$ .................... H02J 7/14; G01N 27/416
(52) U.S. Cl. .................. 320/139; 324/426; 320/136
(58) Field of Search ................... 320/139, 136, 320/134; 324/432, 426, 430

(56) References Cited

U.S. PATENT DOCUMENTS

| 4,433,294 A | | 2/1984 | Windebank |
| 5,049,803 A | | 9/1991 | Palanisamy .................. 320/13 |
| 6,160,382 A | * | 12/2000 | Yoon et al. .................. 320/134 |
| 6,294,897 B1 | * | 9/2001 | Champlin .................... 320/153 |

FOREIGN PATENT DOCUMENTS

DE 42 03 854 9/1992

\* cited by examiner

Primary Examiner—Gregory J. Toatley, Jr.
(74) Attorney, Agent, or Firm—Young & Thompson

(57) ABSTRACT

Method of testing a lead battery for the purpose of charging it under optimal conditions, characterized in that it consists in testing the lead battery for the purpose of obtaining information relating to its condition by applying a test current and/or pulse thereto and by increasing the voltage at the battery terminals.

14 Claims, 4 Drawing Sheets

METHOD OF TESTING A LEAD BATTERY FOR THE PURPOSE OF CHARGING IT UNDER OPTIMAL CONDITIONS

BACKGROUND OF THE INVENTION

1. Field of the Invention

The present invention relates to charging lead accumulators and relates more particularly to charging such accumulators with a free or immobilized electrolyte.

2. Description of the Related Art

It is desirable to determine the state of charge of a battery before even starting to charge it, in order, on the one hand, to estimate its residual capacity, which provides information on the percentage of charge available and, on the other hand, to prevent charging a defective battery which could lead to irreversibly destroying it.

Thus, determining the state of the battery is considered essential for it to be recharged optimally under the best conditions without impairing its life or its nominal capacity according to the number of cycles. However, none of the chargers available on the market provide enough information allowing the state of the battery to be charged to be determined.

Several recharging profiles exist, but the latter do not really take account of the state of charge, they are mainly based on the reaction of the magnetic elements in relation to the voltage of the battery in question since they use either leakage transformers (single or double slope) or ferroresonant chargers whose output voltage is connected to the change in voltage of the battery.

All conventional chargers (chargers operating at the 50 Hz electrical engineering frequencies) generally have a preset timer triggered either at the first step or at the second step called $V_{gas}$. However, if a battery is slightly discharged, charging takes place during the preset time interval which can then heat the battery needlessly. It is also a fact that maintaining the overcharge factor according to the percentage of discharge is not easy.

Several presently known techniques, due to the advances made in electric vehicles and in the understanding of batteries, require the charging voltage of each element or of each monobloc and its temperature to be determined, this being so in order to determine possible discrepancies but also to offset the voltage according to temperature.

For the state of charge to be determined, it is necessary to have available sophisticated electronics measuring all the most relevant parameters (voltages, current, temperature) in order to activate the computing algorithms so as to determine the available energy as described in document FR-2 702 884 A1.

This approach, although valid within the context of an electric vehicle, is not justified in handling equipment when considering the cost of the necessary plant and equipment.

The methods of charging free electrolyte batteries are difficult to transfer to batteries with immobilized "gelled" electrolytes, since the transfer of energy, although identical at the start of charging for a discharged battery, becomes significantly different as soon as the battery voltage reaches its degassing voltage "$V_{gas}$" which is an average 2.37 V/element at 30° C.

This is because, although the increase in voltage above $V_{gas}$ can be tolerated for open lead batteries, it is highly inadvisable for sealed batteries (gelled or absorbed electrolyte battery) since an increase in the potential means an evolution of gas which could lead to a deterioration in the battery or a loss of capacity.

However, as soon as an end-of-charge current of low value (variable between C5/100 and C5/200, instead of C5/20 and C/30 in the case of free electrolyte batteries) is reached, an increase in voltage is then allowed without risk of damage, but with the voltage being limited to a value $V_{max}$ (variable between 2.6 and 2.75 V/element).

Several charging profiles exist, those most commonly used being WA, WOWa, WU, WUIa, IU, IUIa, etc. However, it is advisable to have safety devices available such as charging time limiters depending on the various steps, voltage limiters, and capacity or even temperature limiters for conventional chargers not having a system available to calculate the actual capacity of the battery being charged.

The most suitable profiles for recharging gel or free electrolyte batteries seem to be the WUIa or IUIa profile with, as a variant, control (amplitude, duration) of the end-of-charge current depending on the technology employed, the desired charging time and the necessary charging factor. The role of the end-of-charge current Ia is also to homogenize the electrolyte along the plate in order to allow the end-of-charge voltages of the elements which have not been able to recover their final voltages to reach equilibrium.

Example of the IUIa profile: the latter consists of three different steps:

The first step of current I depends on the capacity of the battery.

This current must be neither too big so as not to damage the elements, nor too small so as not to penalize the charging time of the first step and consequently the total charging duration:

the first possibility is to control the charger according to the battery which is connected to it. However, batteries of different capacities cannot be connected to the same charger; consequently, the charger becomes single capacity;

a second possibility consists in determining the capacity of the battery and in matching the charging current to the capacity and to the state of charge of the battery.

The second step of voltage U depends on the type of battery in question. Also, from 2.37 V/element at 30° C., the internal chemical reaction is enhanced by electrolysis of water, thus creating an evolution of gas. This voltage is called the degassing voltage "$V_{GAS}$". Thus, it is inadvisable to exceed this voltage for sealed batteries otherwise the battery will be destroyed by evolution of gas outside the elements.

The third step of current Ia depends on the technology of the battery used; its amplitude and its duration depend on the capacity C5, on the discharge depth and on the desired charge factor.

EXAMPLES 1) for a gel battery, the current Ia will have an amplitude of between C5/100 and C5/200, and a duration of between 1 and 4 hours depending on the discharge depth and the required charge factor (typically the charge factor is about 1.05 to 1.07);

2) for a free electrolyte battery, the current Ia will have an amplitude of C5/20 and C/30 and a duration of between 1 hour and 3 hours depending on the discharge depth and the required charge factor (typically about 1.15).

SUMMARY OF THE INVENTION

The object of the invention is to optimize the recharging of batteries of the two technology types (sealed and PbO) with the same principles of calculating the capacity so as, on the one hand, to determine the charging current as a function of the battery capacity, but also to optimize the recharging factor in order to prevent any risk of needless heating, and, on the other hand, to provide proper recharging whatever the initial conditions, with a minimum of uncertainty by taking account of faults associated with the battery (deep discharge, unsuitable voltage, defective element, etc).

It also aims to obtain the best compromise for the over-charge factor/discharge factor, the temperature and the age of the battery so as to maintain the capacity of the battery during its life.

The object of the charging method is to improve the existing methods which do not take into account the set of parameters making it possible to optimize recharging. This guarantees full charging of the battery without impairing its life. The method used for recharging lead batteries with a liquefied electrode in addition comprises the profile for a gel battery, current pulses which make it possible to obtain a beneficial effect on the life of the elements, but it also contributes to preventing premature losses of capacity as described in the article "T-AM et al, page 215, Journal of Power Source 53, 1995".

The subject of the invention is therefore a method of testing a lead battery for the purpose of charging it under optimal conditions, characterized in that it consists in testing the lead battery for the purpose of obtaining information relating to its condition by applying a test current and/or pulse thereto and by increasing the voltage at the battery terminals.

According to other characteristics of the invention:

it comprises a step of controlling the current by generating a variable-frequency function intended to produce a test cycle comprising the production of a current which increases up to a reference value chosen according to the capacity of the battery, which is held for a specific time defined by the capacity of the battery and which decreases such that there is significant excitation of the battery until a voltage close to its degassing voltage or greater than this voltage is obtained.

The subject of the invention is also a device for testing a lead battery, characterized in that it comprises a device for controlling the current comprising a variable-frequency function generator intended to produce a test cycle comprising the production of a current which increases up to a reference value chosen according to the capacity of the battery, then is held for a specific time defined by the capacity of the battery and decreases in such a way that there is significant excitation of the battery until a voltage close to its degassing voltage or greater than this voltage is obtained.

According to other characteristics:

the device is a generator of current then of voltage with a large dynamic output range;

the current generator delivers a current of variable slope according to the capacity of the battery.

The method and the associated device may be used in order to obtain information relating to the battery, for example the number of elements, the remaining capacity of the battery and the discharge level. The device and the method may also detect defects before charging is started (battery not voltage-matched, damaged element). Thus, using this diagnosis, the battery will be charged better according to its state while storing deficiencies during the charging cycle.

According to one embodiment of the calculation process using current pulses, of variable amplitude but of fixed duration, this variable amplitude depends on the reaction of the battery voltage. The calculation determines the current at the start of charging after diagnosis, before charging, is started, in order to prevent recharging an unsuitable battery.

During this phase, which is common to both types of technology, the battery state of charge is determined after four to five series of current pulses. This number may vary depending on the battery type: for example, for a gelled electrolyte battery, this number is for example 4, but for free electrolyte batteries, this number may for example exceed 5 for high capacities.

The effects of the first group of pulses is to stimulate the battery, and to prevent certain random phenomena associated with the electrochemical process during reactions. The measurements for estimating the capacity will be made only after a certain time (the time needed to avoid the time constants of the chemical reactions of the positive electrode, and of the negative electrode with the electrolyte). This delay in measurement for a time $T_r$ also makes it possible to avoid transient phenomena which could occur at the start of charging and cause errors in measurement.

BRIEF DESCRIPTION OF THE DRAWINGS

The invention will be better understood on reading the following description, given solely by way of example and made with reference to the appended drawings, in which.

DESCRIPTION OF THE PREFERRED EMBODIMENTS

Figure 1:
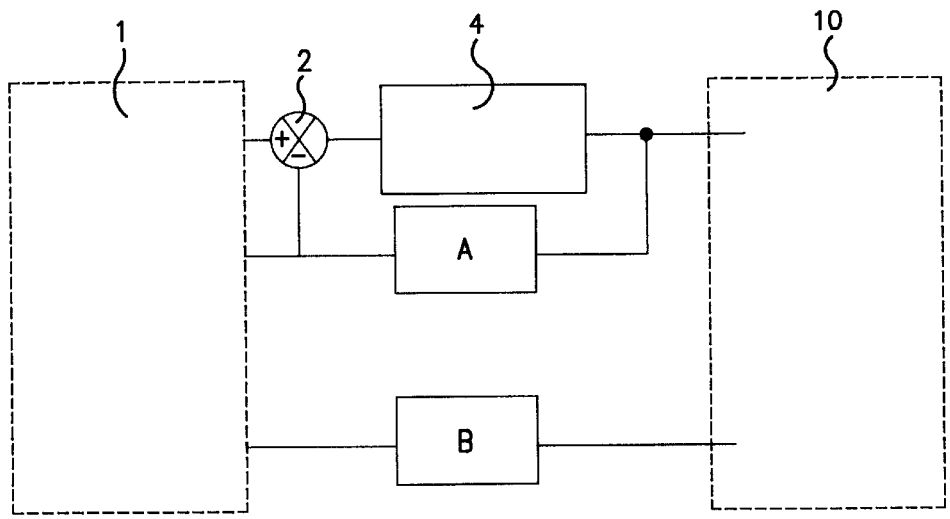
FIG. 1 is a circuit diagram of a charging device fitted with the test device according to the invention.

The charger shown in FIG. 1 comprises a microprocessor 1, to a first output of which is connected an adder 2 whose output is connected to a converter 4.

A second output of the microprocessor 1 is connected to a circuit A for determining a reference current whose input is connected to the negative terminal of the adder 2 and whose output is connected to the output of the converter.

A third output of the microprocessor 1 is connected to a voltage-generator circuit B.

The output of the circuit B is connected to a voltage terminal of a battery 10.

The output of the converter 4 is connected to a current output terminal of the battery 10.

Figure 2:
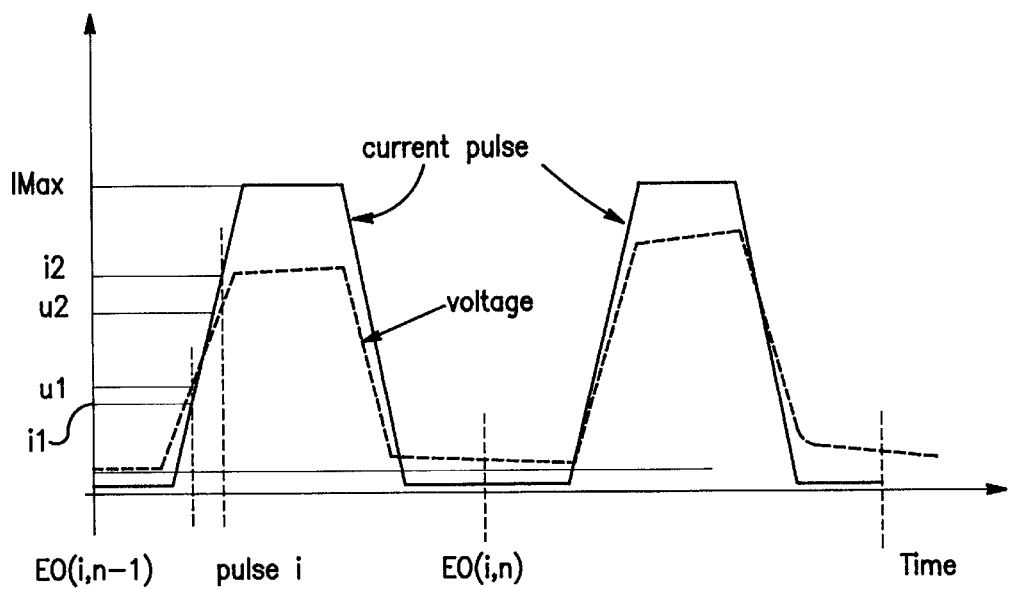
FIG. 2 is a graph showing the waveform of the charging current supplied during the test cycle and the battery voltage in reaction to this current.

FIG. 2 illustrates the waveform of the charging current which is supplied during the test cycle and the battery voltage in reaction to this current. The current level $I_{MAX}$ is controlled according to the actual charging capacity of the battery; for example the pulse current level is equal to the capacity of the battery divided by N (where N is between 4 and 7 depending on the state of charge of the battery). The slope of the positive and negative ramps has to be for example between 20 and 40 A/s depending on the capacity of the battery. A slope of different value can be envisaged.

The duration of the constant current step is set at two seconds, but could be different.

The first group of current pulses is called the "conditioning group"; this agitates the electrolyte and prepares the battery to receive the second group of pulses serving to record the voltage characteristics at the battery terminals.

During the pulses, the percentage of charge which will be stored after 4 to 5 test cycles is calculated as an initial percentage of the battery, but during these cycles the voltage-current characteristics will not be taken since the risk of error is large for a highly discharged battery. In order to prevent this risk, the behavior of the battery voltage at zero current will be analyzed.

The battery voltage is constantly monitored during the test cycle so that it does not exceed the voltage $V_{MAX}$, which would damage the battery.

The pulse amplitude is therefore capped in case of overrun, to return the battery voltage to within the limits acceptable for the battery.

After sending a current pulse of variable duration and amplitude to the battery, the latter acts as an electrical circuit of the type $V_{batt}=E_0+RI$, where R is the bias resistance, I is the excitation current and $E_0$ is the no-load voltage of the battery.

Thus, by means of this pulse, an increase of the RI type is created which is superimposed on a capacitor-type charge by assuming that the bias resistance remains constant for a measurement period.

The measurement period is characterized as described in FIG. 2.

Excitation Phase 1) a linear increase of the type I=a t with a variable slope between 20 A/s and 40 A/s, it being possible for this slope to be greater depending on the capacity of the battery.
2) a step with constant current of variable duration depending on the capacity and state of charge of the battery.
3) a linear decrease of the type I=−a t for the same slope as in case 1.

Relaxation Phase I=0

This phase has a fixed duration whatever the capacity or discharge depth of the battery; it makes it possible to measure the voltage $V_{batt}$ at I=0 so as to determine the change in $E_0$.

The measurement is carried out as follows:

measurement of the no-load voltage in the excitation phase $E_{0(i,n-i)}$, during the excitation phase, various values $u_t(i_t)$ are measured, measurement of the no-load voltage after an excitation phase $E_{o(i,n)}$ i,n ∈ $N^*_+$ where i is the pulse rank and n is the number of measurements.

These measurements will be used in various calculations which will be explained below.

Each measurement pulse makes it possible to provide a good approximation of the nominal capacity of the battery using the voltage-current characteristics. During this pulse, the system stores the voltages $u_1(i_1)$ and $u_2(i_2)$ obtained at respective currents $i_1$ and $i_2$. As can be seen in FIG. 2, these measurements are carried out in the positive ramp of the measurement pulse. The evaluations of the voltage are not carried out directly at the battery terminals. It is necessary to make a correction to compensate for the voltage drop in the power cables.

The calculation of the nominal capacity is based on the voltage variation $du=u_2(i_2)-u_1(i_1)$ in response to a current variation $di=i_2-i_1$, see FIG. 2. The term (du) is corrected in order to compensate for the voltage present at the terminals of the power cables during the evaluation. For this, the parameters of the system must be set according to the following parameters.

b: experimental weighting coefficient (taking account of certain parameters connected to lead batteries).

Δu: voltage drop in the cable:

Δu=R*I where R is the resistance of the cable and

I is the charging current

N represents the number of elements constituting the battery.

The equation will be of the type:

$$C=b*di/[(N*du)-\Delta u)]$$

This calculated capacity will make it possible to determine the starting current of the first step, a current which will subsequently be used to set the parameters for the charging process.

Thus, after the phase of estimating the capacity C5, the charging current depends on the acceptance of the battery. The latter is of the order of the capacity C5/N (where N is a number between 4 and 7 depending on the state of charge of the battery and C5 is the capacity which could be supplied by the battery in 5 h, that is to say 100% of the battery capacity).

To start charging, the battery voltage is raised when the charger outputs its nominal current. This voltage becomes the reference value for controlling the voltage $V_{reg}$. $V_{reg}$ changes with a fixed period but with a variable amplitude. The amplitude of the voltage $V_{reg}$ depends on the change in the state of charge of the battery. The more the battery is charged, the more the value of the control voltage $V_{reg}$ decreases.

Figure 3:
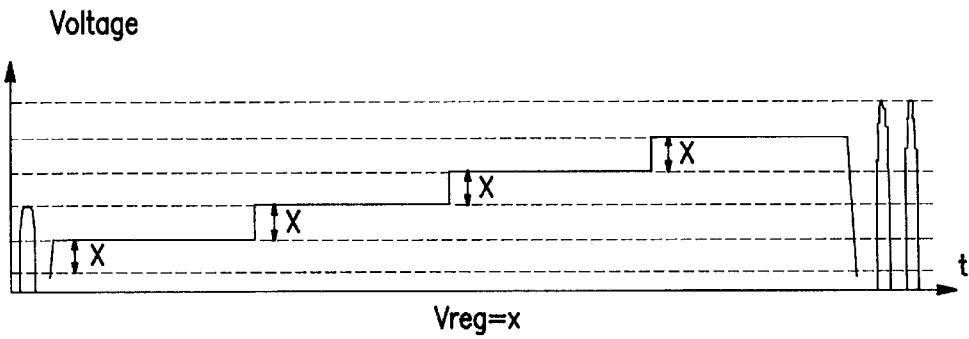
FIG. 3 is a graph of the control voltage in steps as a function of time for a gel battery.
Figure 4:
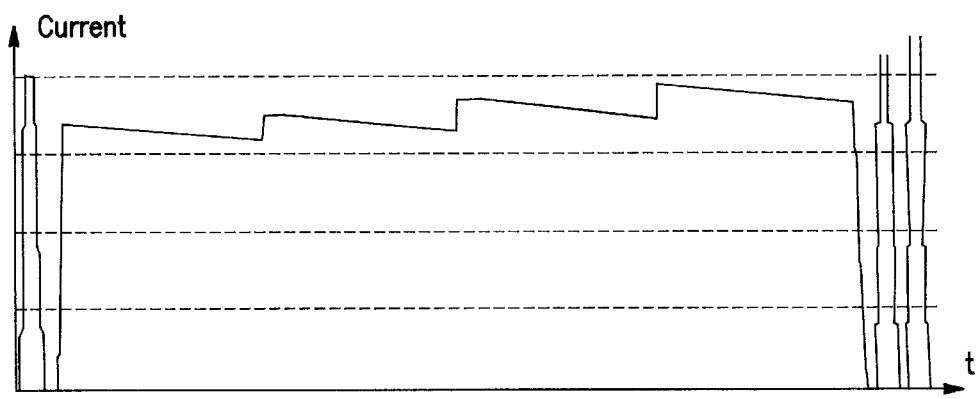
FIG. 4 is a graph of the battery charging current as a function of time with the control voltage of FIG. 3.

Thus, during the control period, if the charging current is greater than the control current, there will then be an increase in the voltage of the battery with respect to the voltage $V_{reg}$, which, through the control loop, will make it necessary to adjust the charging current such that the battery voltage is constant over the control period and equal to $V_{reg}$ as shown in FIGS. 3 and 4.

As for FIG. 3, it shows an example of an application to a gel battery where the control voltage is set by steps of different value, but of fixed duration depending on the change in the total voltage of the battery.

Increasing the voltage in steps makes it possible to control the state of charge of the battery better, and to be able to gauge the acceptance state of the latter, since if, for a given voltage control step, the battery voltage diverges from that of $V_{reg}$, this means that the charging current is not matched to the charge acceptance of the battery, and, consequently, there will be a decrease in the current until a battery voltage which agrees with the change in $V_{reg}$ is obtained.

From then on, the charging profile becomes completely dependent on the change in the control voltage, and, consequently, it can adapt itself according to the behavior of the battery voltage subjected to a charging current. The charging principle which has just been described may be just as valid for charging sealed batteries as for those with an open electrolyte, and, as a result, it is distinguished from the conventional type-IUIa profile.

Thus, by supplying, for example in the context of a gel battery, a reference step at voltage $V_{reg}$, the latter makes it possible to keep the control current during the charging phase at a value close to the maximum current tolerated by the battery, depending on its charging capacity up to a voltage per element of for example between 2.3 and 2.42 V depending on the temperature of the electrolyte in the battery.

After this common phase of estimating the capacity, and of controlling the voltage $V_{reg}$, there are two distinct variants for recharging lead batteries.

Variant 1: Charging a free electrolyte battery.
the voltage of the battery is measured before the measurement pulse ($E_{0(i,n-1)}$) and after the latter ($E_{0(i,n)}$) at a current equal to zero. These two voltages correspond to the difference in potential of the voltage-current characteristics of the battery.

The difference between these two voltages gives the difference $W_i$ (loop width)=$E_{o(i,n)}-E_{0(i,n-1)}$). This difference is characterized by a change in the voltage of the battery reflecting the change in the state of charge. The loop width $E_{0(i,n)}-E_{0(i,n-1)}$ is representative of the charge level of the battery.

Figure 5:
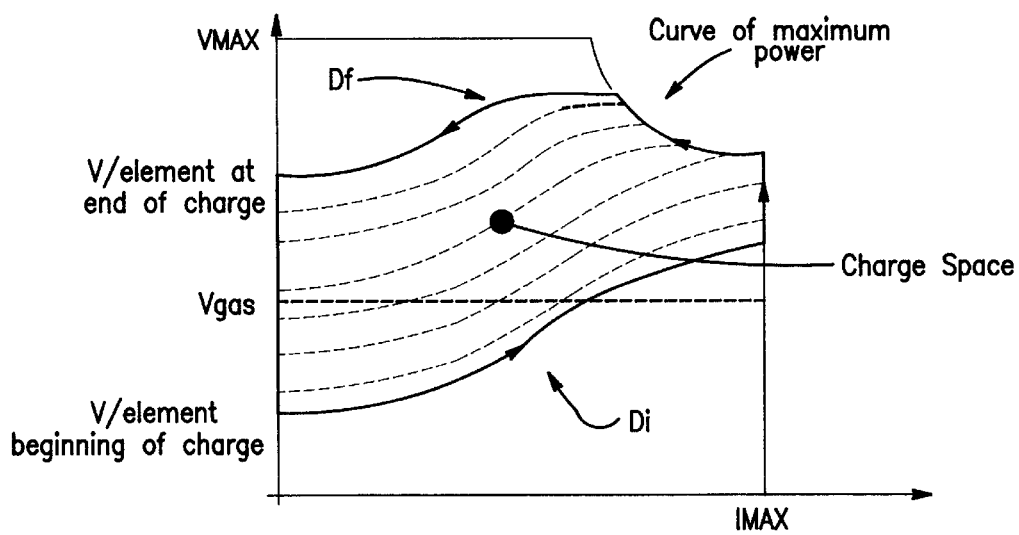
FIG. 5 is a graph showing the maximum power curve.

FIG. 5 shows the start of energy transfer in the case where acceptance of the battery seems to be identical for the two lead technologies (sealed, PbO) and where the efficiency of the energy transfer is maximum in the region Di (initial region); the loop width is virtually zero (high bias resistance). This figure also shows the characteristics of the completely charged battery in the region close to Df (final region), a region in which the change in voltage of the battery is virtually constant within a given current range, then decreases rapidly. The change in characteristics v(i) for a battery charged during measurement and electrical agitation pulses is located close to the saturation zone, which zone could have a harmful effect on the battery if the latter is kept in this charging space, since there would be losses of water by electrolysis and a temperature increase. Also, this zone can be explored without risk by measurement pulses having a very short duration with respect to the normal charging process.

To avoid saturation phenomena in the V, I plane, a maximum output power that is not to be exceeded during the normal charging cycle is necessary, such that whatever the test or analysis cycle, the operating point will remain inside an allowed zone.

Figure 6:
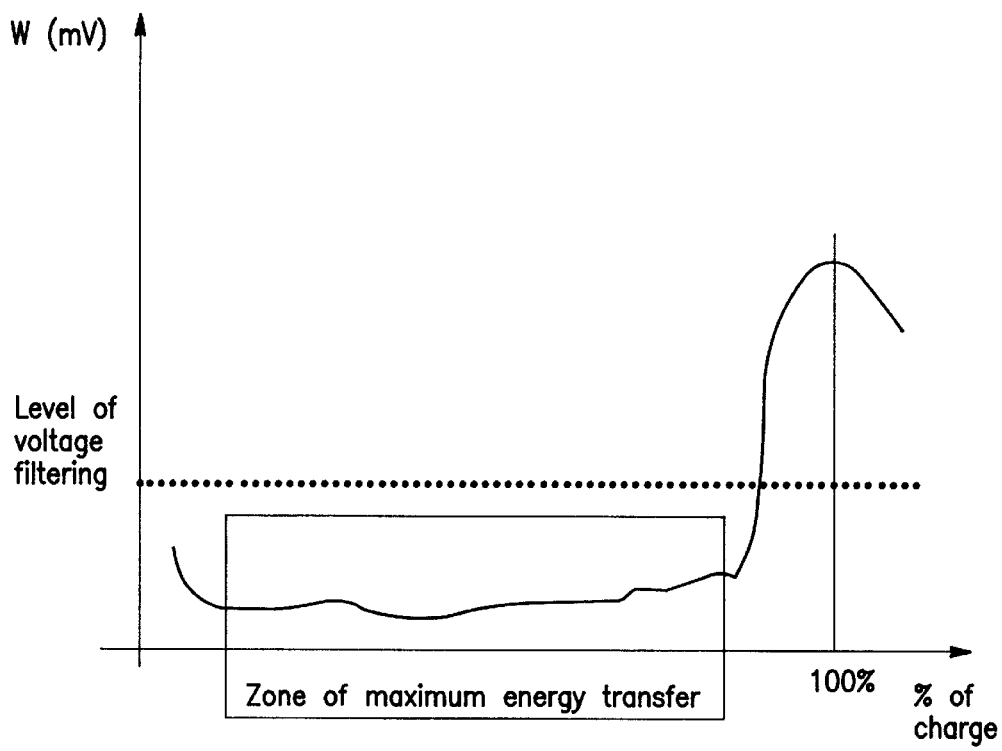
FIG. 6 is a graph showing the variation of the loop width.

FIG. 6 shows the variation in the loop width during charging. It is virtually zero for most of the charging. It increases suddenly on approaching 100% charge to reach a maximum value, then decreases slightly. This sudden increase is explained, on the one hand, by the thermal agitation due to the electrolysis of water for the PbO batteries and, on the other hand, by an increase in the resistance to the flow of electrons in the various layers (Pb, $PbO_2$ and $H_2SO_4$) and a reduction in the bias resistance.

The system driving the charger calculates the slope at each measurement pulse and determines whether the maximum has been reached, in which case 100% charging has been attained.

The method for calculating the percentage of charge makes it possible to estimate the current to be injected at each period of controlling the control voltage during the first charging step. The control period can be varied according to the capacity of the battery to be charged and its percentage of charge. In the present application, it will be, for example, about 6 minutes.

It should be recalled that charging the battery consists of a succession of phases of energy transfer and of measurement pulses of markedly shorter duration. Similarly, the characteristics of the battery are determined during these measurement pulses.

The method of bringing the measurement pulses closer together is based on calculating the percentage of charge. The more the latter increases, the more it is necessary to readjust its calculation according to two principles:
increasing the frequency of the measurement and agitation pulses; in the present application this frequency is multiplied by two;
rebalancing the calculation equations according to the change in the no-load voltage.

However, the measurement pulses must not be too close together at the risk of having variations which are too small, of one measurement pulse over the following pulse, and thus of considering the battery to be totally charged.

The frequency of the current pulses directly affects the estimate of the percentage of charge and also the change in the density characteristics of the electrolyte.

Figure 7:
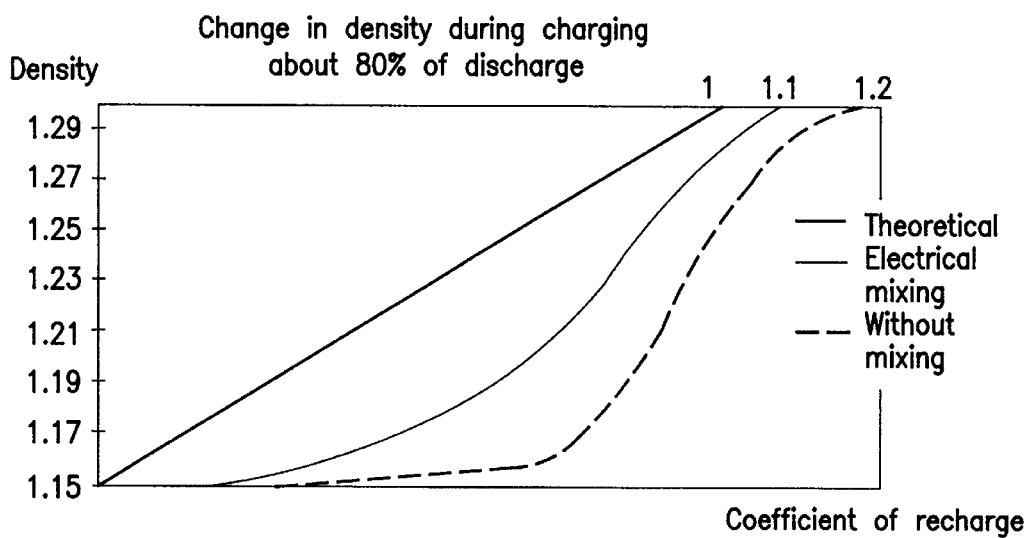
FIG. 7 shows the change in density as a function of the percentage of charge.

This is because the high current levels of these pulses create electrical agitation of the electrolyte, an agitation which makes it possible to obtain good homogeneity of the sulfuric acid $H_2SO_4$ density along the plates in order to avoid stratification phenomena but also a significant reduction in water consumption and the reduction of the charge factor. This variable-frequency electrical agitation depends on the state of charge of the battery. Its change is connected to the calculation of the percentage of charge. The closer the latter is to 100% of the state of charge, the more the frequency increases so as to agitate the electrolyte better and to allow a reduction in the water consumption and an optimization of the charge factor (the typical charge factor for a free electrolyte battery discharged to 80% is about 1.15 to obtain a density of 1300 at 30° C. making it possible to have a fully charged battery; as a result of the electrical agitation, the charge factor is reduced to 1.08–1.10 giving a density of 1300 at 30° C. and a completely charged battery). An example is thus supplied by FIG. 7 showing the change in density as a function of the percentage of charge.

Figure 8:
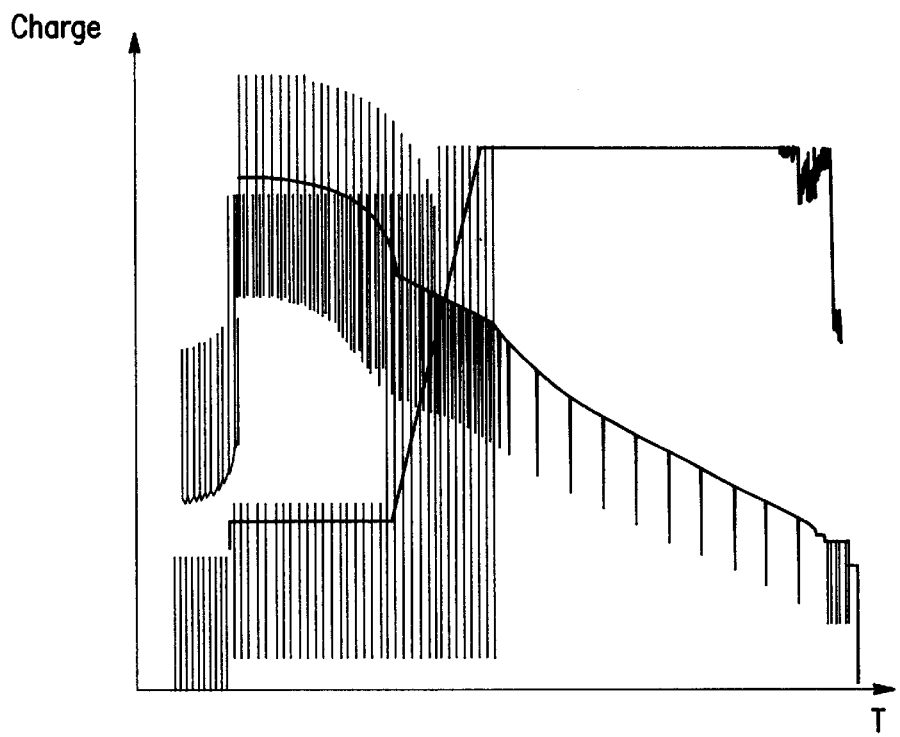
FIG. 8 shows a typical example of a profile comprising the method according to the invention.

In addition, the electrical (ionic) agitation has a beneficial effect on battery aging as described in the article-.T-AM et al., page 215, Journal of Power Source 53, 1995. A typical example of a profile comprising this method is shown in FIG. 8.

It is these measurement pulses which are at the base of this method. This is because, at the start of each measurement pulse, that is to say when the current delivered becomes equal to zero, the battery voltage is increased. From this voltage, called the battery relaxation voltage, the correspondence with different charge levels is established using a table pre-established following several tests. This provides the information concerning the effective charge level of the battery.

As the energy transfer continues, the charge level may be determined using a measurement pulse.

Figure 9:
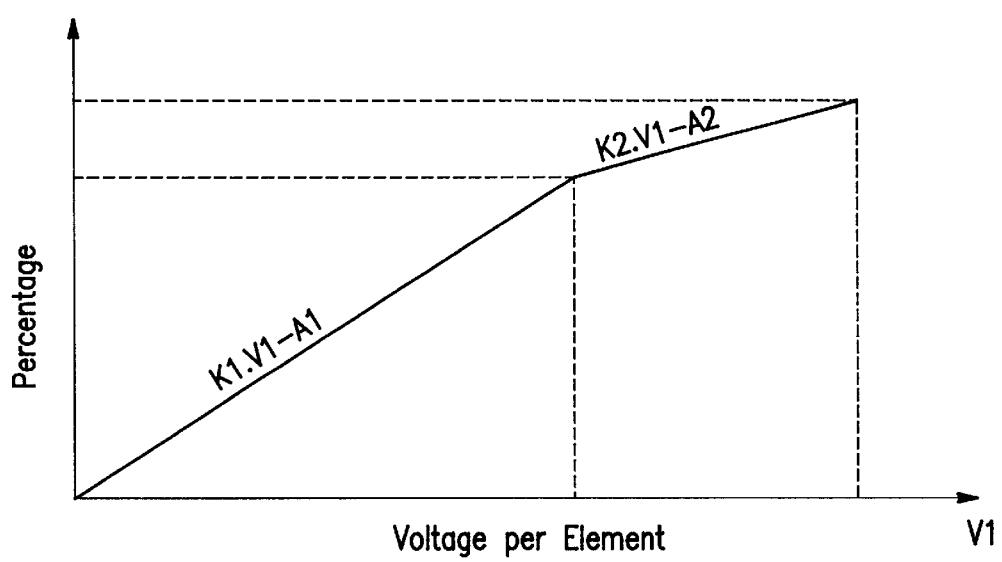
FIG. 9 is a curve showing the change in the percentage of charge as a function of the no-load voltage and the connection between this characteristic and that of the loop width.

FIG. 9 is the curve showing the change in percentage of charge as a function of the no-load voltage, and the connection between this characteristic and that of the loop width. Thus, using these two characteristics, the change in charge is controlled better by controlling its charging current.

The initial and final (100%) percentages of charge also make it possible to set the end-of-charge current depending on the capacity of the battery and consequently to optimize the charge factor according to the criteria of the battery manufacturers.

Once the battery is completely charged, the maintenance charging phase is activated, depending on the calculated end-of-charge current, in the form of a pulse. A charge profile example is appended in FIG. 8 specifying the shape of the curve, and the presence of calculation and electrical (ionic) agitation pulses.

Variant 2: Charging and gel battery

The IUIa profile for a gelled electrolyte battery is differentiated mainly in its second and third phases compared to that for the free electrolyte battery.

This is because, as has been mentioned in the preamble, it is necessary to take certain precautions when recharging gel batteries, such as the strict compliance with the control voltage (in this case this is 2.37 V/element at 30° C.), but also compliance with the end-of-charge current and with its duration.

The charging method thus defined makes it possible to charge a sealed (gel) battery under the best conditions for the battery. This method makes it possible to recharge various capacity ranges (capacity limited only by the output power of the charger) without any adaptation, since the method will automatically adapt its charging process to the capacity of the battery and to its discharge depth, thus avoiding any abnormal heating of or risk of damage to the battery.

The means stated above thus make it possible to provide, via a charger with a large dynamic range, the possibility of charging various types of battery technologies, voltages and capacities and as a result to have a charger with a multi-voltage functionality (for example a charger may charge a battery of 24 V or 36 V or 48 V without any operator intervention) and multicapacity functionality (the same charger may charge a battery of 250 Ah or a battery of 600 Ah without any operator intervention).

What is claimed is:

1. A method of testing a lead battery for the purpose of charging it under optimal conditions, wherein it consists in testing the lead battery for the purpose of obtaining information relating to its condition by applying a test current thereto and by increasing the voltage at the battery terminals, and wherein the method comprises a step of controlling the current by generating a variable-frequency function intended to produce a test cycle comprising the production of a current which increases up to a reference value chosen according to the capacity of the battery, which is held for a specific time defined by the capacity of the battery and which decreases such that there is significant excitation of the battery until a voltage close to its degassing voltage or greater than this voltage is obtained.

2. The method according to claim 1, wherein at the start of each measurement pulse, when the current delivered to the battery becomes equal to zero, the battery voltage is increased from this voltage called the battery relaxation voltage, the correspondence with different charge levels is established using a table pre-established following several tests and information concerning the effective charge level of the battery is thus obtained.

3. The method as claimed in claim 1, which comprises a step of calculating the percentage of charge making it possible to estimate the current to be injected at each period of controlling the control voltage during a first charging step.

4. The method as claimed in claim 3, wherein the control of the current varies according to the capacity of the battery to be charged and its percentage of charge.

5. A method for charging a lead battery, comprising establishing a first current control period during which a charging current is adjusted to the charge acceptance and the state of charge of the battery, and performing a test on said battery according to the method of claim 1.

6. The method as claimed in claim 5 wherein the first current control period consists of adjusting the charging current such that the increasing of the voltage is performed in steps of different values and of fixed duration.

7. The method as claimed in claim 6 which is applied to an immobilized electrolyte battery.

8. The method as claimed in claim 7, further comprising the steps of establishing a voltage control period and establishing a second current control period.

9. A device for testing a lead battery, which comprises a device for controlling the current comprising a variable-frequency generator (1, 2, 4) intended to produce a test cycle comprising the production of a current which increases up to a reference value chosen according to the capacity of the battery (10), then is held for a specific time defined by the capacity of the battery and decreases in such a way that there is significant excitation of the battery until a voltage close to its degassing voltage or greater than this voltage is obtained.

10. The device as claimed in claim 9, which comprises a generator of current (A) then of voltage (B) with a large dynamic output range.

11. The device as claimed in claim 10, wherein the current generator (4, A) delivers a current of variable slope according to the capacity of the battery.

12. The device according to claim 9, which comprises a system (1) driving the charger which calculates the slope of the current at each measurement pulse and determines whether the maximum has been reached, resulting in 100% charge.

13. A device for charging a lead battery comprising means for determining a current, voltage-generator means and which further comprises a device for testing as claimed in claim 9.

14. The device as claimed in claim 13 wherein the voltage-generator means delivers a current such that the increasing of the voltage is set by steps of different values and of fixed duration.

* * * * *